United States Patent
Lee et al.

(10) Patent No.: US 9,466,376 B1
(45) Date of Patent: Oct. 11, 2016

(54) SEMICONDUCTOR MEMORY DEVICE AND OPERATING METHOD THEREOF

(71) Applicant: SK hynix Inc., Icheon-si Gyeonggi-do (KR)

(72) Inventors: Hee Youl Lee, Icheon-si (KR); Hyun Seung Yoo, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/868,586

(22) Filed: Sep. 29, 2015

(30) Foreign Application Priority Data

May 26, 2015 (KR) .................. 10-2015-0073019

(51) Int. Cl.
  *G11C 16/06* (2006.01)
  *G11C 16/10* (2006.01)
  *G11C 16/34* (2006.01)

(52) U.S. Cl.
  CPC ........... *G11C 16/10* (2013.01); *G11C 16/3459* (2013.01)

(58) Field of Classification Search
  CPC ............................ G11C 16/00; G11C 16/349
  USPC ................... 365/185.22, 185.19, 185.03
  See application file for complete search history.

(56) References Cited

U.S. PATENT DOCUMENTS

| | | | | |
|---|---|---|---|---|
| 2011/0013457 A1* | 1/2011 | Han | ..................... | G11C 11/5628 365/185.18 |
| 2011/0194353 A1* | 8/2011 | Hwang | ............... | G11C 11/5628 365/185.19 |
| 2016/0049200 A1* | 2/2016 | Park | ................... | G11C 16/3459 365/185.19 |

FOREIGN PATENT DOCUMENTS

| KR | 1020140074552 A | 6/2014 |
|---|---|---|
| KR | 1020150143113 A | 12/2015 |

* cited by examiner

*Primary Examiner* — Han Yang
(74) *Attorney, Agent, or Firm* — William Park & Associates Ltd.

(57) ABSTRACT

A semiconductor memory device includes a memory cell array including a plurality of memory cells, a peripheral circuit for applying a program voltage and verifying whether a program of the memory cell array has been completed, and a control logic for controlling the peripheral circuit to apply an increased program voltage to the memory cell array while applying a reprogram permission voltage to a bit line coupled to the memory cells that previously passed a program verification but has failed a program re-verification.

16 Claims, 7 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2015-0073019 filed on May 26, 2015, in the Korean Intellectual Property Office, the entire disclosure of which is incorporated by reference herein.

BACKGROUND

1. Technical Field

Various embodiments of the present disclosure generally relate to an electronic device, and more particularly to a semiconductor memory device and an operating method thereof.

2. Related Art

Semiconductor memory devices can be broadly classified into volatile memory devices and nonvolatile memory devices.

A non-volatile memory device is a form of memory that retains stored data even when its power supply is cut off. Accordingly, the non-volatile memory device is typically used for the task of long-term persistent storage. Examples of the non-volatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories can be broadly classified into NOR-type flash memories and NAND-type flash memories.

The NOR-type flash memories is basically a random access memory, which allows data to be read or written in almost the same amount of time data no matter where the data are stored in the memory. The NAND-type flash memories are widely used as a storage medium of portable electronic devices such as digital cameras, smart phones, and laptop computers.

SUMMARY

Embodiments provide a semiconductor memory device and an operating method thereof, which can prevent the threshold voltage distribution of memory cells of which programming is completed from being changed when a program operation of the semiconductor memory device is performed, thereby improving retention characteristics of the semiconductor memory device.

According to an aspect of the present disclosure, there is provided a semiconductor memory device, including: a memory cell array including a plurality of memory cells; a peripheral circuit configured to apply a program voltage and verify whether a program of the memory cell array has been completed; and a control logic configured to control the peripheral circuit to apply an increased program voltage to the memory cell array while applying a reprogram permission voltage to a bit line coupled to a memory cell that previously passed a program verification but has failed a program re-verification.

According to an aspect of the present disclosure, there is provided a method of operating a semiconductor memory device, the method including: applying a program voltage to memory cells selected among a plurality of memory cells; performing a program verification operation on the selected memory cells; if at least one memory cell has not passed the program verification, applying an increased program voltage to the memory cells; and if any previously-verification-passed memory cell is found to have failed a program verification in a program re-verification operation, applying an increased program voltage to the memory cell while applying a reprogram permission voltage to a bit line coupled to the memory cell.

According to an aspect of the present disclosure, there is provided a method of operating a semiconductor memory device, the method including: applying a program voltage to memory cells selected among a plurality of memory cells; performing a program verification operation on the selected memory cells; applying an increased program voltage to word lines while applying a program prohibition voltage to bit lines coupled to memory cells that have passed a program verification and applying a program permission voltage to bit lines coupled to memory cells that have never passed the program verification; performing a first program re-verification operation on memory cells that have passed the program verification; and applying an increased program voltage while applying a first reprogram permission voltage to bit lines coupled to memory cells that previously passed the program verification but has failed the first program re-verification.

BRIEF DESCRIPTION OF THE DRAWINGS

In the drawing figures, dimensions may be exaggerated for clarity of illustration. The accompanying figures, in which like reference numerals refer to identical or functionally similar elements throughout the separate views and which together with the detailed description below are incorporated in and form part of the specification, serve to further illustrate various embodiments and explain various principles and advantages all in accordance with the present invention.

DETAILED DESCRIPTION

Example embodiments will now be described more fully hereinafter with reference to the accompanying drawings.

Subject matter may, however, be embodied in a variety of different forms and should not be construed as limited to any example embodiments set forth herein. Rather, these embodiments are provided so that this disclosure will be thorough and complete, and will fully convey the scope of the example embodiments to those skilled in the art.

In the following detailed description, only certain example embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. It will be understood that when an element is referred to as being "between" two elements, it can be the only element between the two elements, or one or more intervening elements may also be present. In addition, when an element is referred to as "including" a component, this indicates that the element may further include another component instead of excluding another component unless there is different disclosure.

Figure 1:
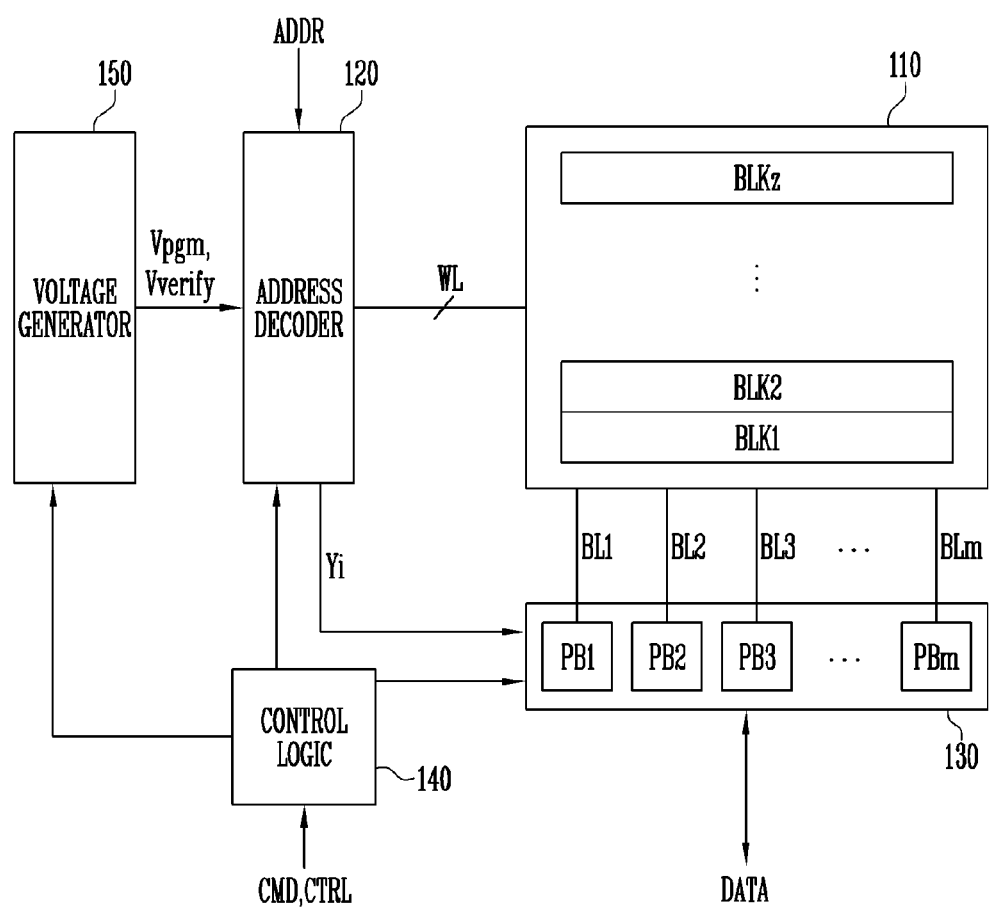
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz may be coupled to the address decoder 120 through word lines WL. The plurality of memory blocks BLK1 to BLKz may be coupled to the read/write circuit 130. Each of the memory blocks BLK1 to BLKz includes a plurality of memory cells. In an embodiment, the plurality of memory cells may include nonvolatile memory cells. For instance, the plurality of memory cells may include floating-gates or charge-trap-layer to store electric charges therein. In NAND flash architecture, an erase operation is performed on a block basis, whereas read and program operations are performed on a page basis. A word line is shared between all cells in a single page, and a plurality of pages form a single block. In addition, the memory cell array 110 includes a plurality of cell strings. For instance, each of the plurality of memory blocks BLK1 to BLKz includes a plurality of cell strings. Each of the plurality of cell strings includes a drain select transistor, a plurality of drain-side memory cells, a pipe transistor, a plurality of source-side memory cells, and a source select transistor, which are coupled in series between a bit line and a source line.

The address decoder 120, the read/write circuit 130, control logic 140, and the voltage generator 150 are used in various operations of the memory cell array 110.

The address decoder 120 is coupled to the memory cell array 110 through the word lines WL. The address decoder 120 operates in response to control signals of the control logic 140. The address decoder 120 receives an address ADDR through an address buffer (not shown) that may be used when moving the address ADDR into the semiconductor memory device 100.

When program voltages are applied to word lines during a program operation, the address decoder 120 decodes a row address out of the address ADDR and applies a program voltage Vpgm and a pass voltage, which are generated by the voltage generator 150, to the plurality of word lines WL according to the decoded row address. When a program verification operation is performed, the address decoder 120 applies, to a selected word line, a verification voltage Vverify generated by the voltage generator 150.

The program operation of the semiconductor memory device 100 is performed on a page basis. The address ADDR, which is received when the program operation is requested, includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, an address buffer, and the like.

The read/write circuit 130 includes a plurality of page buffers PB1 to PBm coupled to the memory cell array 110 through bit lines BL1 to BLm. Each of the plurality of page buffers PB1 to PBm temporarily stores data DATA that are inputted when a program operation is performed and controls a voltage level of the corresponding bit line BL1 to BLm according to the temporarily stored data. When a program verification operation is performed, each of the page buffers PB1 to PBm detects a voltage level of the corresponding bit line BL1 to BLm in the memory cell array 110, compares the voltage level with the data temporarily stored when the program operation is performed, and sets the voltage level of the corresponding bit line BL1 to BLm to a program permission voltage or a program prohibition voltage depending on the result of comparison. In an embodiment of the present invention, in a situation where memory cells that have passed a previous verification are supposed to be reprogrammed, page buffers PB1 to PBm may increase voltage levels of bit lines coupled to the memory cells that are supposed to be reprogrammed to predetermined voltage levels (hereinafter referred to as "reprogram permission voltage) higher than a normal program permission voltage. For instance, the reprogram permission voltage may be a voltage lower than a power voltage $V_{DD}$ and higher than a ground voltage $V_{SS}$. For instance, the reprogram permission voltage may be higher than the normal program permission voltage by multiples of a step voltage Vstep of an incremental step pulse program (hereinafter referred to as "ISPP"). For example, the reprogram permission voltage may be higher than the normal program permission voltage by a voltage that is double the step voltage 2Vstep or triple the step voltage 3Vstep.

The read/write circuit 130 operates in response to control signals of the control logic 140.

In an example embodiment, the read/write circuit 130 may include page buffers (e.g., page registers), a column select circuit, and the like.

The control logic 140 is coupled to the address decoder 120, the read/write circuit 130, and the voltage generator 150. The control logic 140 receives a command CMD through an input/output buffer (not shown). The control logic 140 controls overall operations of the semiconductor memory device 100 in response to the command CMD. The control logic 140 controls the address decoder 120, the read/write circuit 130, and the voltage generator 150 to perform an ISPP operation when a program operation is performed, and controls the read/write circuit 130 to set a voltage level of a bit line according to results of program verification. The control logic 140 may control the address decoder 120, the read/write circuit 130, and the voltage generator 150 to reprogram memory cells that had passed previous program verifications but have failed a program re-verification. Moreover, the control logic 140 may control the read/write circuit 130 so that bit lines coupled to the memory cells having failed a program re-verification can have reprogram permission voltages, which are higher than the normal program permission voltage.

The voltage generator 150 generates the program voltage Vpgm and the pass voltage when program voltages are applied to word lines during a program operation. The voltage generator 150 also generates the verification voltage Vverify and the pass voltage when a program verification operation is performed during the program operation. The voltage generator 150 generates the program voltage Vpgm to be gradually increased by a step voltage as the number of times of applying the program voltage Vpgm increases.

Figure 2:
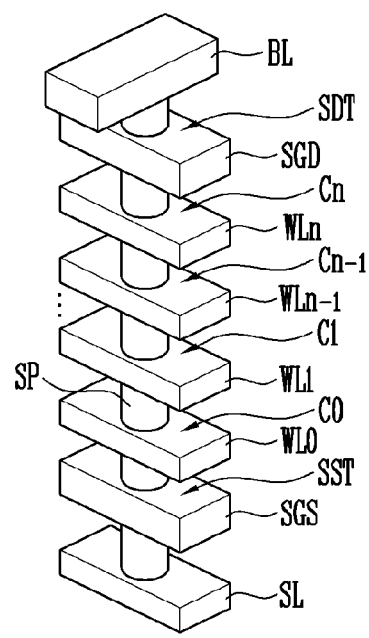
FIG. 2 is a three-dimensional diagram illustrating a memory string included in a memory block according to an embodiment of the present disclosure.
Figure 3:
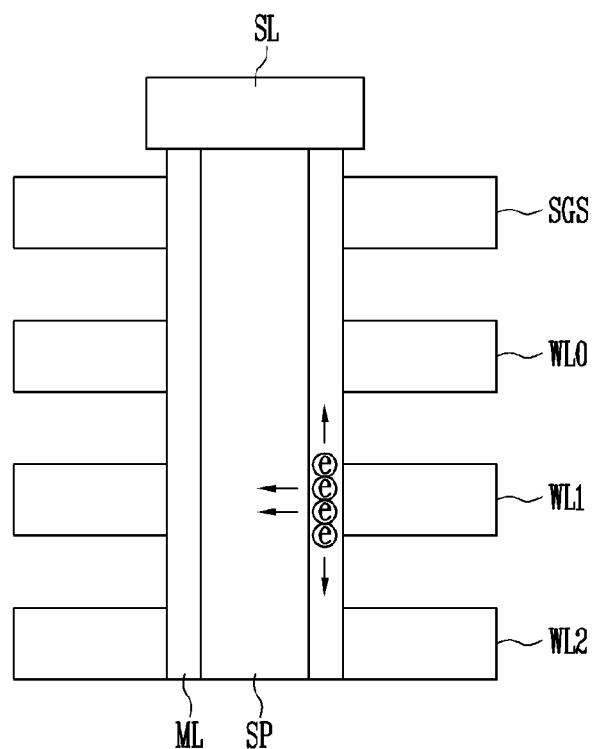
FIG. 3 is a configuration diagram illustrating retention characteristics of a programmed memory cell.

FIG. 2 is a three-dimensional diagram illustrating a memory string included in a memory block according to an embodiment of the present disclosure. FIG. 3 is a configuration diagram illustrating retention characteristics of a programmed memory cell.

Referring to FIGS. 2 and 3, a common source line SL is formed on a semiconductor substrate. A vertical channel layer SP is formed on the common source line SL. The top of the vertical channel layer SP is coupled to a bit line BL. The vertical channel layer SP may be formed of polysilicon. A plurality of conductive layers SGS, WL0 to WLn, and SGD may be formed to surround the vertical channel layer SP at different heights of the vertical channel layer SP. A multilayer ML including a charge storage layer is formed on a surface of the vertical channel layer SP. The multilayer ML is also positioned between the vertical channel layer SP and the conductive layers SGS, WL0 to WLn, and SGD. The multilayer ML may be formed in an ONO structure in which an oxide layer, a nitride layer, and an oxide layer are sequentially laminated.

A lowermost conductive layer becomes a source select line SGS, and an uppermost conductive layer becomes a drain select line SGD. The conductive layers between the source select line SGS and the drain select line SGD become word lines WL0 to WLn. In other words, the conductive layers SGS, WL0 to WLn, and SGD are formed in a plurality of layers above the semiconductor substrate, and the vertical channel layer SP penetrating the conductive layers SGS, WL0 to WLn, and SGD is vertically coupled between the bit line BL and the common source line SL formed on the semiconductor substrate.

A drain select transistor SDT is formed at a portion where the uppermost conductive layer SGD surrounds the vertical channel layer SP. A source select transistor SST is formed at a portion where the lowermost conductive layer SGS surrounds the vertical channel layer SP. Memory cells C0 to Cn are formed at portions where the intermediate conductive layers WL0 to WLn surround the vertical channel layer SP.

In the above-described memory cells C0 to Cn, electrons existing in the vertical channel layer SP when a program operation is performed are tunneled by a program voltage and therefore trapped in the charge storage layer of the multilayer ML. However, some of the trapped electrons are detrapped from the multilayer ML or moved to an adjacent area just after the program operation is performed. Therefore, memory cells determined as having passed a program verification may fail another program verification that is carried out later on.

Figure 4:
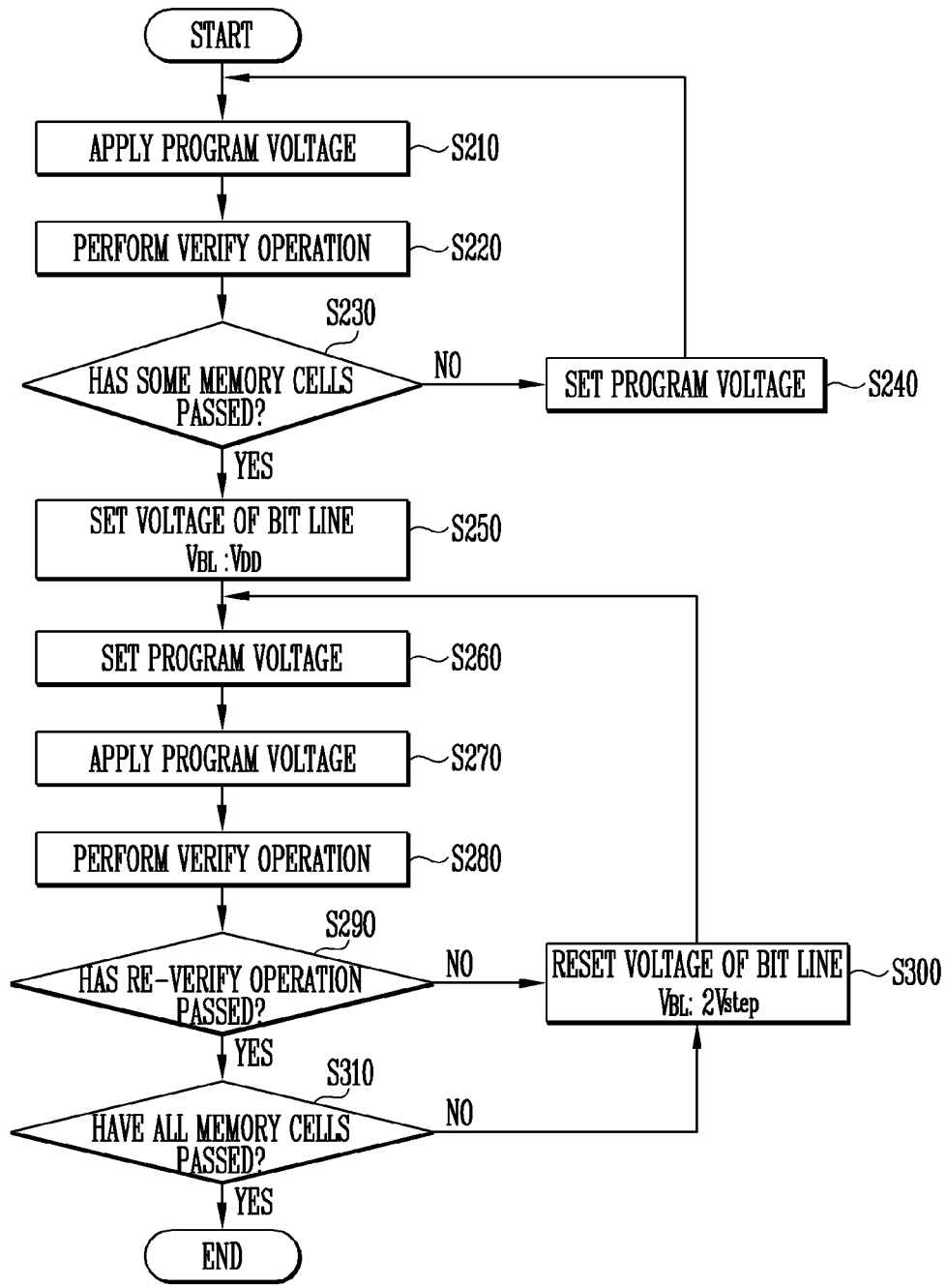
FIG. 4 is a flowchart illustrating an operating method of the semiconductor memory device according to an embodiment of the present disclosure.

FIG. 4 is a flowchart illustrating an operating method of the semiconductor memory device according to an embodiment of the present disclosure.

An operation of the semiconductor memory device according to an embodiment of the present disclosure will be described as follows with reference to FIGS. 1 to 4.

Once a program operation starts, a program voltage Vpgm is applied (S210).

In response to a command CMD and a control signal CTRL that are provided for a program operation, the control logic 140 controls the read/write circuit 130 such that program data DATA are temporarily stored in a plurality of page buffers PB1 to PBm.

The plurality of page buffers PB1 to PBm may control voltage levels of corresponding bit lines BL1 to BLm according to the temporarily stored program data DATA.

The control logic 140 controls the voltage generator 150 to generate a program voltage Vpgm. The program voltage Vpgm generated by the voltage generator 150 is applied to a word line selected among a plurality of word lines WL by the address decoder 120.

After a predetermined program voltage has been applied, a program verification operation is performed (S220).

During this period, the control logic 140 controls the voltage generator 150 to generate a verification voltage Vverify. The verification voltage Vverify generated by the voltage generator 150 is applied to the word line to which the program voltage Vpgm has been applied.

While the verification voltage Vverify is applied, the plurality of page buffers PB1 to PBm may detect whether the word line has been programmed (S230).

That is, the plurality of page buffers PB1 to PBm may detect whether threshold voltages of memory cells coupled thereto have become higher than a target threshold voltage.

According to a result of the verify operation, the plurality of page buffers PB1 to PBm may change voltage levels of bit lines BL1 to BLm from the program permission voltage to the program prohibition voltage, or may maintain the voltage levels of bit lines BL1 to BLm at the program permission voltage.

If there is no memory cell that has passed the program verification, a new program voltage Vpgm that is higher than the previous program voltage Vpgm is applied (S240).

The control logic 140 sets the new program voltage Vpgm increased by a step voltage, and controls peripheral circuits to re-perform the above-described processes.

When at least one memory cell among the plurality of memory cells coupled to the selected word line has passed the program verification, the read/write circuit 130 may change voltage levels of program-verification-passed bit lines BL1 to BLm from the program permission voltage to the program prohibition voltage and maintain, at the program permission voltage, the voltage levels of bit lines BL1 to BLm coupled to memory cells that have not passed the program verification (S250).

Next, the control logic 140 sets the new program voltage Vpgm increased by a step voltage (S260).

The control logic 140 controls the voltage generator 150 to generate the new program voltage Vpgm. The new program voltage Vpgm generated by the voltage generator 150 is applied to the word line selected among the plurality of word lines WL by the address decoder 120 (S270).

After the new program voltage has been applied, a program re-verification operation is performed (S280).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S280).

The plurality of page buffers PB1 to PBm may detect whether the threshold voltages of memory cells coupled thereto have become higher than the target threshold voltage. In an embodiment, the program re-verification operation is performed with respect to not only memory cells that have not passed any program verification but also memory cells that have passed a program verification (S290). In an embodiment, if any previously-verification-passed memory cell is found to have failed the program re-verification, it is subject to the next program operations.

In an embodiment, the reprogram permission voltage, which is higher than the normal program permission voltage, may be applied to the bit lines BL1 to BLm coupled to the memory cell that previously passed the program verification but has failed the program re-verification (S300).

When a memory cell that previously passed the program verification is found to have failed the program re-verification, the read/write circuit 130 applies the reprogram permission voltage, which is lower than the program prohibition voltage $V_{DD}$ and higher than a normal program permission voltage $V_{SS}$, to the bit lines coupled to those memory cells. In an embodiment, the reprogram permission voltage may be higher than a normal program permission voltage $V_{SS}$ by multiples of a step voltage Vstep in an ISPP operation. For example, the reprogram permission voltage may be a double step voltage 2Vstep. The reprogram permission voltage is set to be higher than the normal program permission voltage $V_{SS}$ so as not to over-program the memory cell that is subject to the reprogram operation.

The voltage level $V_{BA}$ of a bit line coupled to the memory cells that have passed the program re-verification is controlled to be the program prohibition voltage $V_{DD}$. The memory cells other than the memory cells that have changed their program-verification status maintain the previous voltage level of the bit line.

The reprogram permission voltage may be increased as the program voltage increases, and the increment of the program voltage may be a voltage equal to or smaller than the step voltage Vstep.

In a reprogram operation, the control logic 140 sets a new program voltage Vpgm increased by a step voltage (S260).

The new program voltage Vpgm generated by the voltage generator 150 is applied to the word line selected among the plurality of word lines WL by the address decoder 120 (S270).

After the new program voltage has been applied, a program re-verification operation is performed (S280).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S280).

The program re-verification operation is performed with respect to not only memory cells that have not passed any program verification but also memory cells that have passed a program verification (S290).

Next, whether all the memory cells have passed the program verification (e.g., program verifications and program re-verifications) is checked (S310). When all the memory cells have passed the program verification (e.g., program verifications and program re-verifications), the program operation is ended. If there is at least one memory cell that has not passed the program verification or program re-verification, the above-described processes are re-performed from the step S300.

According to an embodiment of the present disclosure, even if a memory cell has passed a program verification once, the memory cell is subject to program re-verification, and if the threshold voltage of the memory cell has dropped below its base voltage level, then an additional program voltage is applied to the word line coupled to the memory cell while maintaining the bit line coupled thereto at the reprogram permission voltage, which is higher than the normal program permission voltage. Thus, it is possible to prevent the threshold voltage distribution of memory cells from being widened due to deterioration of data retention characteristics.

Figure 5:
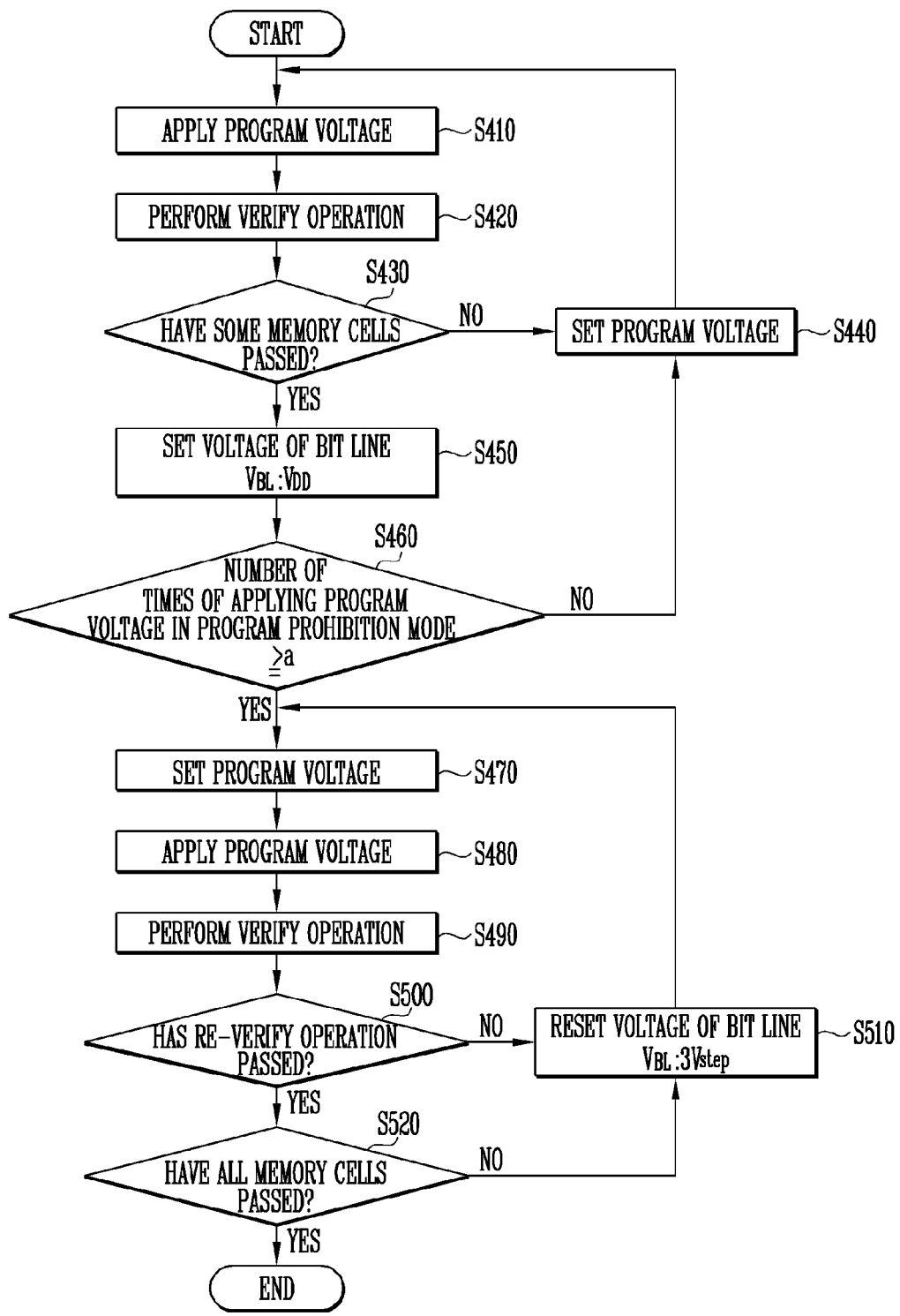
FIG. 5 is a flowchart illustrating an operating method of the semiconductor memory device according to an embodiment of the present disclosure.

FIG. 5 is a flowchart illustrating an operating method of the semiconductor memory device according to an embodiment of the present disclosure.

An operation of the semiconductor memory device according to an embodiment of the present disclosure will be described as follows with reference to FIGS. 1 to 3 and 5.

Once a program operation starts, a program voltage Vpgm is applied (S410).

In response to a command CMD and a control signal CTRL that are provided for a program operation, the control logic 140 controls the read/write circuit 130 such that program data DATA are temporarily stored in a plurality of page buffers PB1 to PBm.

The plurality of page buffers PB1 to PBm may control voltage levels of corresponding bit lines BL1 to BLm according to the temporarily stored program data DATA.

The control logic 140 controls the voltage generator 150 to generate a program voltage Vpgm. The program voltage Vpgm generated by the voltage generator 150 is applied to a word line selected among a plurality of word lines WL by the address decoder 120.

After a predetermined program voltage has been applied, a program verification operation is performed (S420).

During this period, the control logic 140 controls the voltage generator 150 to generate a verification voltage Vverify. The verification voltage Vverify generated by the voltage generator 150 is applied to the word line to which the program voltage Vpgm has been applied.

While the verification voltage Vverify is applied, the plurality of page buffers PB1 to PBm may detect whether the word line has been programmed (S430).

That is, the plurality of page buffers PB1 to PBm may detect whether threshold voltages of memory cells coupled thereto have become higher than a target threshold voltage.

According to a result of the verify operation, the plurality of page buffers PB1 to PBm may change voltage levels of bit lines BL1 to BLm from the program permission voltage to the program prohibition voltage, or may maintain the voltage levels of bit lines BL1 to BLm at the program permission voltage.

If there is no memory cell that has passed the program verification, a new program voltage Vpgm that is higher than the previous program voltage Vpgm is applied (S440).

The control logic 140 sets the new program voltage Vpgm increased by a step voltage, and controls peripheral circuits to re-perform the above-described processes.

When at least one memory cell among the plurality of memory cells coupled to the selected word line has passed the program verification, the read/write circuit 130 may change voltage levels of program-verification-passed bit lines BL1 to BLm from the program permission voltage to the program prohibition voltage and maintain, at the program permission voltage, the voltage levels of bit lines BL1 to BLm coupled to memory cells that have not passed the program verification (S450).

In an embodiment, the number of times the program voltages are applied in a program prohibition mode is counted (S460).

After the voltage of the bit line is set (S450), the number of times the program voltages are applied in a program prohibition mode is counted to determine whether the number is greater than or equal to a set number (e.g., "a" in FIG. 5) or smaller than the set number. For instance, the set number may be two. If the number of times, for which the program voltages are applied in the state in which the program prohibition voltage $V_{DD}$ is applied to the bit line coupled to the memory cells that have passed a program verification, is less than the set number of times, the above-described processes are re-performed from the step S440.

If the number of times, for which the program voltages are applied in the state in which the program prohibition voltage $V_{DD}$ is applied to the bit line coupled to the memory cells that have passed a program verification, is greater than the set number of times, the control logic 140 sets the new program voltage Vpgm increased by a step voltage (S470).

The control logic 140 controls the voltage generator 150 to generate the new program voltage Vpgm. The new program voltage Vpgm generated by the voltage generator 150 is applied to the selected word line selected among the plurality of word lines WL by the address decoder 120 (S480).

After the new program voltage has been applied, a program re-verification operation is performed (S490).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S490).

The plurality of page buffers PB1 to PBm may detect whether the threshold voltages of memory cells coupled thereto have become higher than the target threshold voltage. In an embodiment, the program re-verification operation is performed with respect to not only memory cells that have not passed any program verification but also memory cells that have passed a program verification (S500). In an embodiment, if any previously-verification-passed memory cell is found to have failed the program re-verification, it is subject to the next program operations.

In an embodiment, the reprogram permission voltage, which is higher than the normal program permission voltage, may be applied to the bit lines BL1 to BLm coupled to the memory cell that previously passed the program verification but has failed the program re-verification (S510).

When a memory cell that previously passed the program verification is found to have failed the program re-verification, the read/write circuit 130 applies the reprogram permission voltage, which is lower than the program prohibition voltage $V_{DD}$ and higher than a normal program permission voltage $V_{SS}$, to the bit lines coupled to those memory cells. In an embodiment, the reprogram permission voltage may be higher than a normal program permission voltage $V_{SS}$ by multiples of a step voltage Vstep in an ISPP operation. For example, the reprogram permission voltage may be a triple step voltage 3Vstep. The reprogram permission voltage is set to be higher than the normal program permission voltage $V_{SS}$ so as not to over-program the memory cell that is subject to the reprogram operation.

The voltage level $V_{BA}$ of a bit line coupled to the memory cells that have passed the program re-verification is controlled to be the program prohibition voltage $V_{DD}$. The memory cells other than the memory cells that have changed their program-verification status maintain the previous voltage level of the bit line.

The reprogram permission voltage may be increased as the program voltage increases, and the increment of the program voltage may be a voltage equal to or smaller than the step voltage Vstep.

In a reprogram operation, the control logic 140 sets a new program voltage Vpgm increased by a step voltage (S470).

The new program voltage Vpgm generated by the voltage generator 150 is applied to the word line selected among the plurality of word lines WL by the address decoder 120 (S480).

After the new program voltage has been applied, a program re-verification operation is performed (S490).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S490).

The program re-verification operation is performed with respect to not only memory cells that have not passed any program verification but also memory cells that have passed a program verification (S500).

Next, whether all the memory cells have passed the program verification (e.g., program verifications and program re-verifications) is checked (S520). When all the memory cells have passed the program verification (e.g., program verifications and program re-verifications), the program operation is ended. If there is at least one memory cell that has not passed the program verification or program re-verification, the above-described processes are re-performed from the step S510.

According to an embodiment of the present disclosure, even if a memory cell has passed a program verification once, the memory cell is subject to program re-verification, and if the threshold voltage of the memory cell has dropped below its base voltage level, then an additional program voltage is applied to the word line coupled to the memory cell while maintaining the bit line coupled thereto at the reprogram permission voltage, which is higher than the normal program permission voltage. Thus, it is possible to prevent the threshold voltage distribution of memory cells from being widened due to deterioration of data retention characteristics. Also, whether to perform a re-verification operation is determined based on the number of times the program voltages are applied in a program prohibition mode, so that the reprogram operation can be performed after the threshold voltage distribution has widened. Thus, it is possible to further improve the threshold voltage distribution.

Figure 6:
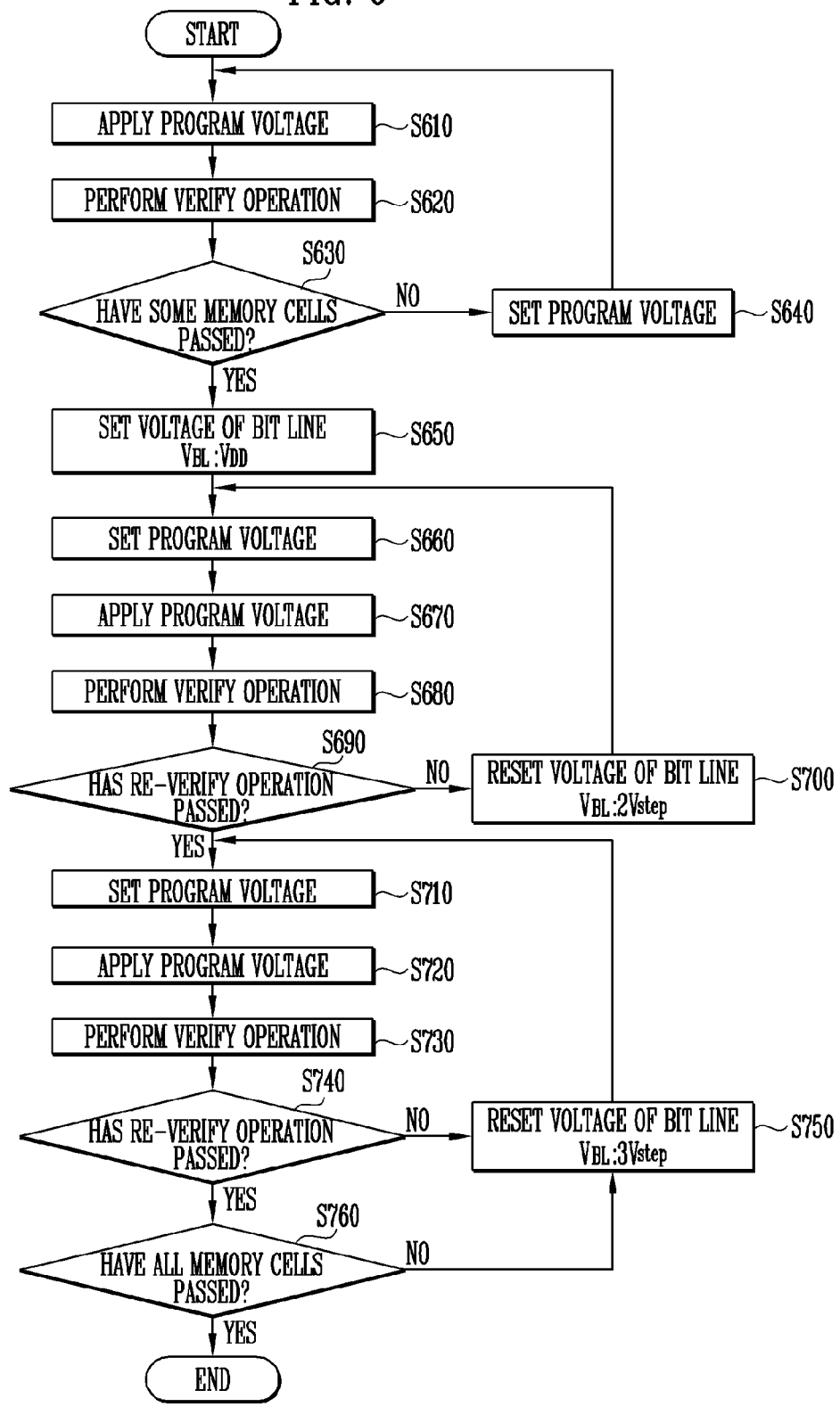
FIG. 6 is a flowchart illustrating an operating method of the semiconductor memory device according to an embodiment of the present disclosure.

FIG. 6 is a flowchart illustrating an operating method of the semiconductor memory device according to still another embodiment of the present disclosure.

An operation of the semiconductor memory device according to an embodiment of the present disclosure will be described as follows with reference to FIGS. 1 to 3 and 6.

Once a program operation starts, a predetermined program voltage is applied (S610)

In response to a command CMD and a control signal CTRL that are provided for a program operation, the control logic 140 controls the read/write circuit 130 such that program data DATA are temporarily stored in a plurality of page buffers PB1 to PBm.

The plurality of page buffers PB1 to PBm may control voltage levels of corresponding bit lines BL1 to BLm according to the temporarily stored program data DATA.

The control logic 140 controls the voltage generator 150 to generate a program voltage Vpgm. The program voltage Vpgm generated by the voltage generator 150 is applied to a word line selected among a plurality of word lines WL by the address decoder 120.

After a predetermined program voltage has been applied, a program verification operation is performed (S620).

During this period, the control logic 140 controls the voltage generator 150 to generate a verification voltage Vverify. The verification voltage Vverify generated by the voltage generator 150 is applied to the word line to which the program voltage Vpgm has been applied.

While the verification voltage Vverify is applied, the plurality of page buffers PB1 to PBm may detect whether the word line has been programmed (S630).

That is, the plurality of page buffers PB1 to PBm may detect whether threshold voltages of memory cells coupled thereto have become higher than a target threshold voltage.

According to a result of the verify operation, the plurality of page buffers PB1 to PBm may change voltage levels of bit lines BL1 to BLm from the program permission voltage to the program prohibition voltage, or may maintain the voltage levels of bit lines BL1 to BLm at the program permission voltage.

If there is no memory cell that has passed the program verification, a new program voltage Vpgm that is higher than the previous program voltage Vpgm is applied (S640).

The control logic 140 sets the new program voltage Vpgm increased by a step voltage, and controls peripheral circuits to re-perform the above-described processes.

When at least one memory cell among the plurality of memory cells coupled to the selected word line has passed the program verification, the read/write circuit 130 may change voltage levels of program-verification-passed bit lines BL1 to BLm from the program permission voltage to the program prohibition voltage and maintain, at the program permission voltage, the voltage levels of bit lines BL1 to BLm coupled to memory cells that have not passed the program verification (S650).

Next, the control logic 140 sets the new program voltage Vpgm increased by a step voltage (S660).

The control logic 140 controls the voltage generator 150 to generate the new program voltage Vpgm. The new program voltage Vpgm generated by the voltage generator 150 is applied to the word line selected among the plurality of word lines WL by the address decoder 120 (S670).

After the new program voltage has been applied, a program re-verification operation is performed (S680).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S280).

The plurality of page buffers PB1 to PBm may detect whether the threshold voltages of memory cells coupled thereto have become higher than the target threshold voltage. In an embodiment, the program re-verification operation is performed with respect to not only memory cells that have not passed any program verification but also memory cells that have passed a program verification (S690). In an embodiment, if any previously-verification-passed memory cell is found to have failed the program re-verification, it is subject to the next program operations.

In an embodiment, the reprogram permission voltage, which is higher than the normal program permission voltage, may be applied to the bit lines BL1 to BLm coupled to the memory cell that previously passed the program verification but has failed the program re-verification (S700).

When a memory cell that previously passed the program verification is found to have failed the program re-verification, the read/write circuit 130 applies a first reprogram permission voltage, which is lower than the program prohibition voltage $V_{DD}$ and higher than a normal program permission voltage $V_{SS}$, to the bit lines coupled to those memory cells. In an embodiment, the first reprogram permission voltage may be higher than a normal program permission voltage $V_{SS}$ by a double step voltage 2Vstep in an ISPP operation. For example, the first reprogram permission voltage may be a double step voltage 2Vstep. The first reprogram permission voltage is set to be higher than the normal program permission voltage $V_{SS}$ so as not to over-program the memory cell that is subject to the reprogram operation.

The voltage level $V_{BA}$ of a bit line coupled to the memory cells that have passed the program re-verification is controlled to be the program prohibition voltage $V_{DD}$. The memory cells other than the memory cells that have changed their program-verification status maintain the previous voltage level of the bit line.

In a reprogram operation, the control logic 140 sets a new program voltage Vpgm increased by a step voltage (S710).

If none of previously-verification-passed memory cells are found to have failed the program re-verification, the control logic 140 sets a new program voltage Vpgm increased by a step voltage (S710).

The control logic 140 controls the voltage generator 150 to generate the new program voltage Vpgm. The new program voltage Vpgm generated by the voltage generator 150 is applied to the word line selected among the plurality of word lines WL by the address decoder 120 (S720).

After the new program voltage has been applied, a program re-verification operation is performed (S730).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S730).

The plurality of page buffers PB1 to PBm may detect whether the threshold voltages of memory cells coupled thereto have become higher than the target threshold voltage. In an embodiment, the program re-verification operation is performed with respect to not only memory cells that have not passed any program verification but also memory cells that have passed a program verification (S740). In an embodiment, if any previously-verification-passed memory cell is found to have failed the program re-verification, it is subject to the next program operations.

In an embodiment, the reprogram permission voltage, which is higher than the normal program permission voltage, may be applied to the bit lines BL1 to BLm coupled to the memory cell that previously passed the program verification but has failed the program re-verification (S750).

When a memory cell that previously passed the program verification is found to have failed the program re-verification, the read/write circuit 130 applies a second reprogram permission voltage, which is lower than the program prohibition voltage $V_{DD}$ and higher than a normal program permission voltage $V_{SS}$, to the bit lines coupled to those memory cells. In an embodiment, the second reprogram permission voltage may be a set multiple of a step voltage Vstep in an ISPP operation. For example, the second reprogram permission voltage may be higher than a normal program permission voltage $V_{SS}$ by a triple step voltage 3Vstep. The second reprogram permission voltage is set to be higher than the normal program permission voltage $V_{SS}$ so as not to over-program the memory cell that is subject to the reprogram operation.

The voltage level $V_{BA}$ of a bit line coupled to the memory cells that have passed the program re-verification is controlled to be the program prohibition voltage $V_{DD}$. The memory cells other than the memory cells that have changed their program-verification status maintain the previous voltage level of the bit line.

In a reprogram operation, the control logic 140 sets a new program voltage Vpgm increased by a step voltage (S710).

Next, the control logic 140 controls the voltage generator 150 to generate the new program voltage Vpgm. The new program voltage Vpgm generated by the voltage generator 150 is applied to the word line selected among the plurality of word lines WL by the address decoder 120 (S720).

After the new program voltage has been applied, a program re-verification operation is performed (S730).

In the program re-verification operation, the control logic 140 controls the voltage generator 150 to generate a verification voltage Vverify. The verification voltage Vverify generated by the voltage generator 150 is applied to the word line selected among the plurality of word lines WL by the address decoder 120.

While the verification voltage Vverify is applied, the plurality of page buffers PB1 to PBm may detect whether the word line has been programmed (S730).

The plurality of page buffers PB1 to PBm may detect whether the threshold voltages of memory cells coupled thereto have become higher than the target threshold voltage.

Again, the program re-verification operation is performed with respect to not only memory cells that have not passed any program verification but also memory cells that have passed a program verification (S740).

If there is at least one memory cell that has not passed the program verification or program re-verification, the above-described processes are re-performed from the step S750.

Also, whether all the memory cells have passed the program verification (e.g., program verifications and program re-verifications) is checked (S760).

When all the memory cells have passed the program verification (e.g., program verifications and program re-verifications), the program operation is ended. If there is at least one memory cell that has not passed the program verification or program re-verification, the above-described processes are re-performed from the step S750.

According to an embodiment of the present disclosure, even if a memory cell has passed a program verification once, the memory cell is subject to program re-verification, and if the threshold voltage of the memory cell has dropped below its base voltage level, then an additional program voltage is applied to the word line coupled to the memory cell while maintaining the bit line coupled thereto at the reprogram permission voltage, which is higher than the normal program permission voltage. Thus, it is possible to prevent the threshold voltage distribution of memory cells from being widened due to deterioration of data retention characteristics. Also, a reprogram permission voltage applied to a bit line is increased as the number of times the program and verification operations are performed increases, so that memory cells that are subject to reprogram operations can be quickly programmed.

Figure 7:
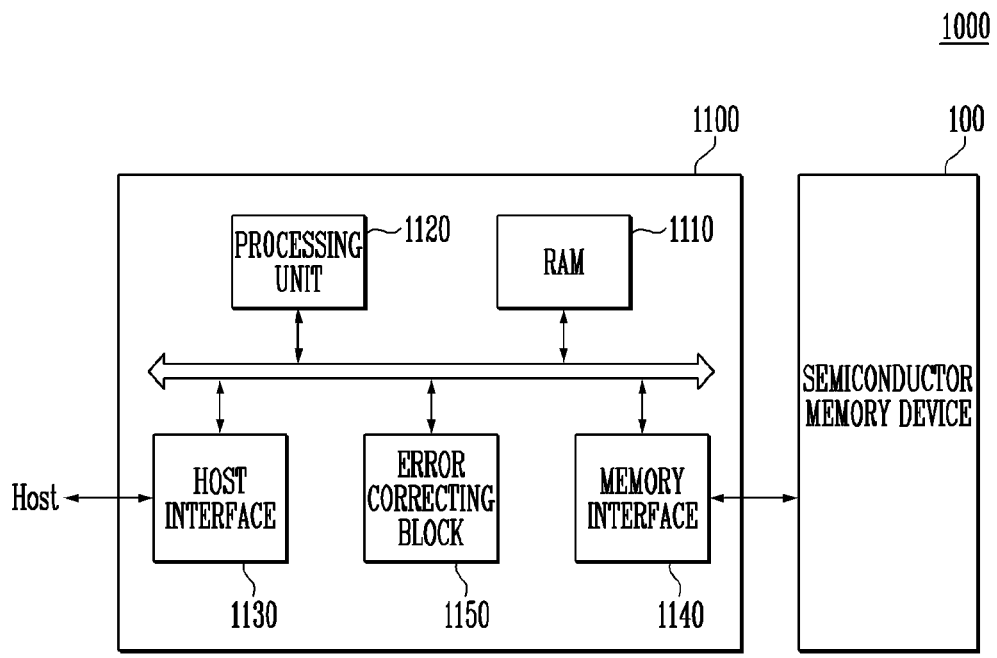
FIG. 7 is a block diagram illustrating a memory system including the semiconductor memory device of FIG. 1.

FIG. 7 is a block diagram illustrating a memory system including the semiconductor memory device of FIG. 1.

Referring to FIG. 7, the memory system 1000 includes a semiconductor memory device 100 and a controller 1000.

The semiconductor memory device 100 may be identical to the semiconductor memory device described with reference to FIG. 1, and therefore a repeated description thereof will be omitted.

The controller 1000 is coupled to a host Host and the semiconductor memory device 100. The controller 1000 accesses the semiconductor memory device 100 in response to a request from the host Host. For example, the controller 1000 controls read, write, erase, and background operations of the semiconductor memory device 100. The controller 1000 provides an interface between the semiconductor memory device 100 and the host Host. The controller 1000 drives firmware for controlling the semiconductor memory device 100.

The controller 1000 includes a random access memory (hereinafter referred to as "RAM") 1110, a processing unit 1120, a host interface 1130, a memory interface 1140, and an error correcting block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls overall operations of the controller 1100. Also, the controller 1100 may arbitrarily store program data provided from the host Host when a read operation is performed.

The host interface 1130 includes a protocol for exchanging data between the host Host and the controller 1100. In an embodiment, the controller 1100 communicates with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correcting block 1150 detects and corrects an error in data received from the semiconductor memory device 100 by using an error correcting code (ECC). The processing unit 1120 may adjust a read voltage based on an error detection result of the error correcting block 1150, and control the semiconductor memory device 100 to perform a re-read operation. In an embodiment, the error correcting block 1150 may be provided as a component of the controller 1100.

The controller 1100 and the semiconductor memory device 100 may be integrated into one semiconductor device. In an embodiment, the controller 1100 and the semiconductor memory device 100 may be integrated into one semiconductor device to constitute a single memory card. For example, the controller 1100 and the semiconductor memory device 100 may be integrated into one semiconductor device to constitute a memory card such as a PC card such as a personal computer memory card international association (PCMCIA), a compact flash (CF) card, a smart media card (SMC), a memory stick, a multimedia card (e.g., MMC, RS-MMC or MMCmicro), an SD card (e.g., SD, miniSD, microSD or SDHC), or a universal flash storage (UFS).

The controller 1100 and the semiconductor memory device 100 may be integrated into one semiconductor device to constitute a semiconductor drive such as a solid state drive (hereinafter referred to as "SSD"). The semiconductor drive SSD includes a storage device configured to store data in a semiconductor memory. If the memory system 1000 is used as the semiconductor drive SSD, the operating speed of the host Host coupled to the memory system 1000 can be improved.

In an embodiment, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computer system.

In embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 8:
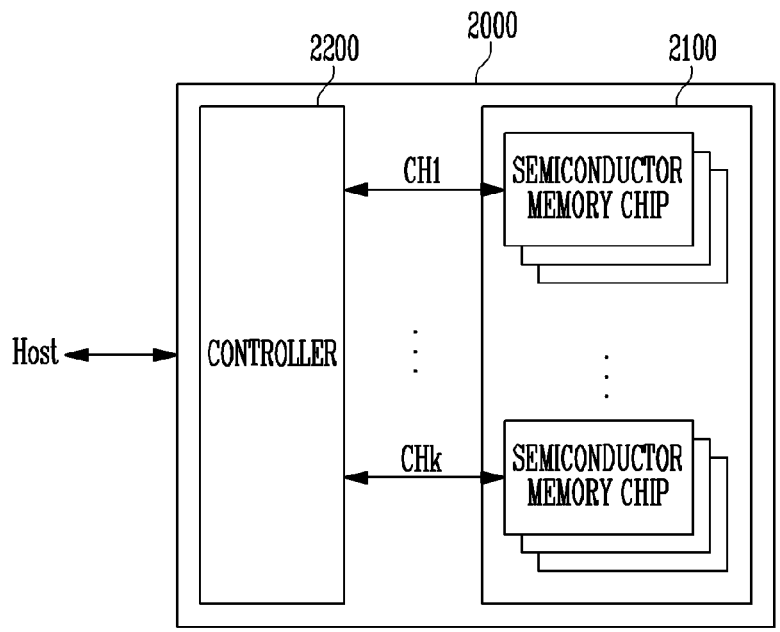
FIG. 8 is a block diagram illustrating an application example of the memory system of FIG. 7.

FIG. 8 is a block diagram illustrating an application example of the memory system of FIG. 7.

Referring to FIG. 8, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 8, the plurality of groups communicating with the controller 2200 through first to kth channels CH1 to CHk is illustrated. Each semiconductor memory chip may be configured and operate like the semiconductor memory devices 100 described with reference to FIG. 1.

Each group communicates with the controller 2200 through a common channel. The controller 2200 is configured similarly to the controller 1100 described with reference to FIG. 6. The controller 2200 controls the plurality of memory chips of the semiconductor memory device 2100 through the plurality of channels CH1 to CHk.

Figure 9:
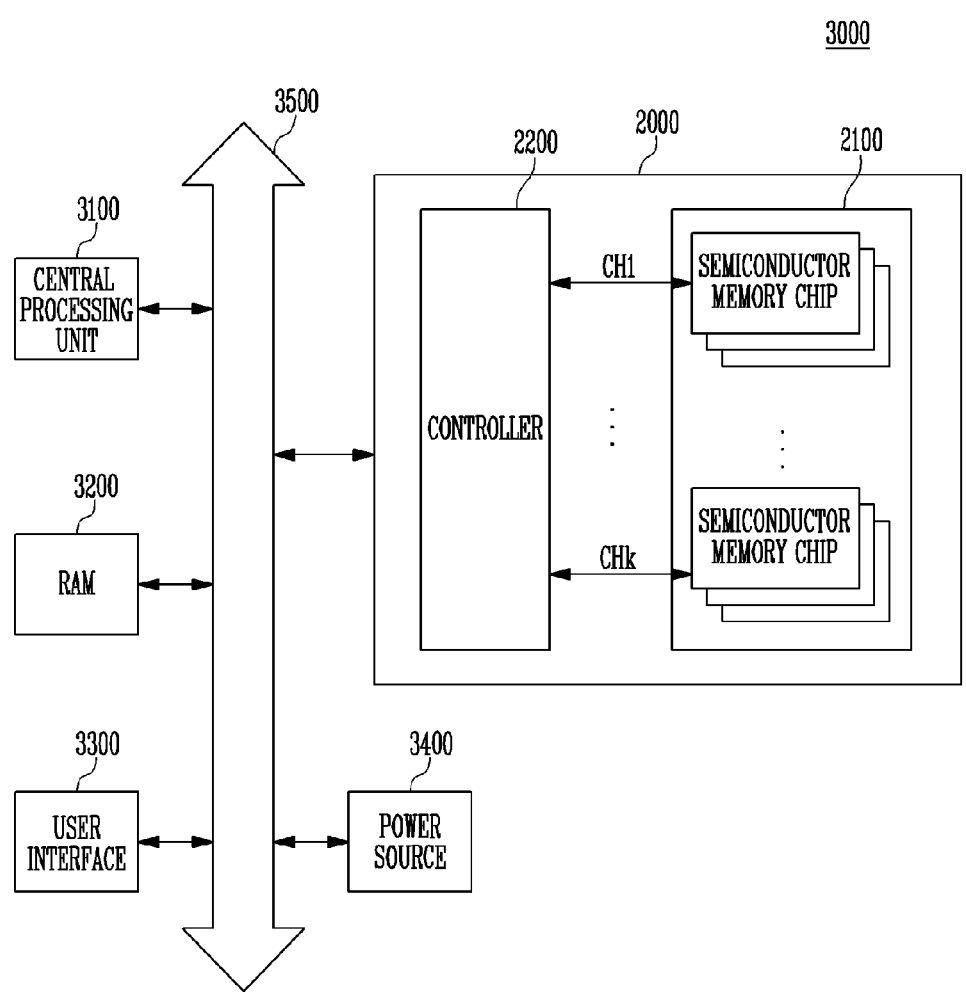
FIG. 9 is a block diagram illustrating a computer system including the memory system described with reference to FIG. 8.

FIG. 9 is a block diagram illustrating a computer system including the memory system described with reference to FIG. 8.

Referring to FIG. 10, the computer system 300 includes a central processing unit 3100, a RAM 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 9, it is illustrated that the semiconductor memory device 2100 is coupled to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 9, it is illustrated that the memory system 2000 described with reference to FIG. 8 is provided. However, the memory system 2000 may be replaced by the memory system 1000 described with reference to FIG. 8. In an embodiment, the computer system 3000 may include both the memory systems 1000 and 2000 described with reference to FIGS. 7 and 8.

In an embodiment, a re-verification operation is performed on memory cells that previously have passed a program verification, and then a reprogram operation is performed on the previously-verification-passed memory cells that are found to have failed the program re-verification. In an embodiment, during the reprogram operation, a voltage level of a bit line coupled to the memory cell that is subject to the reprogram operation (i.e., a reprogram permission voltage) is higher than a normal program permission voltage. Thus, it is possible to improve data retention characteristics of the semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory cells;
a peripheral circuit configured to apply a program voltage and verify whether a program of the memory cell array has been completed; and
a control logic configured to control the peripheral circuit to apply an increased program voltage to the memory cell array while applying a reprogram permission voltage to a bit line coupled to a memory cell that previously passed a program verification but has failed a program re-verification,
wherein the reprogram permission voltage is lower than a program prohibition voltage and higher than a program permission voltage.

2. The semiconductor memory device of claim 1, wherein the control logic controls the peripheral circuit such that a program voltage is increased by a step voltage as program operations are repeatedly performed.

3. The semiconductor memory device of claim 2, wherein the reprogram permission voltage is a voltage two or three times greater than the step voltage.

4. The semiconductor memory device of claim 1, wherein, if program voltages are repeatedly applied for a set number of times to the memory cells in a program prohibition mode that previously have passed a program verification, a re-verification operation is performed on the memory cells.

5. The semiconductor memory device of claim 1, wherein the control logic increases the reprogram permission voltage as the number of times program and verification operations are performed increases.

6. The semiconductor memory device of claim 5, wherein the control logic gradually increases the reprogram permission voltage by a voltage equal to or lower than a step voltage.

7. A method of operating a semiconductor memory device, the method including:
applying a program voltage to memory cells selected among a plurality of memory cells;
performing a program verification operation on the selected memory cells;
if at least one memory cell has not passed the program verification, applying an increased program voltage to the memory cells; and
if any previously-verification-passed memory cell is found to have failed a program verification in a program re-verification operation, applying an increased program voltage to the memory cell while applying a reprogram permission voltage to a bit line coupled to the memory cell,
wherein the reprogram permission voltage is lower than a program prohibition voltage and higher than a program permission voltage.

8. The method of claim 7, wherein the reprogram permission voltage is a voltage two or three times greater than the step voltage.

9. The method of claim 7, wherein, if program voltages are repeatedly applied for a set number of times to the memory cells that previously have passed a program verification in a program prohibition mode, a re-verification operation is performed on the memory cells.

10. The method of claim 9, wherein the program voltage is applied to word lines after a program prohibition voltage is applied to a bit line coupled to the memory cells that have passed the program verification.

11. A method of operating a semiconductor memory device, the method comprising:
applying a program voltage to memory cells selected among a plurality of memory cells;
performing a program verification operation on the selected memory cells;
applying an increased program voltage to word lines while applying a program prohibition voltage to bit lines coupled to memory cells that have passed a program verification and applying a program permission voltage to bit lines coupled to memory cells that have never passed the program verification;
performing a first program re-verification operation on memory cells that have passed the program verification; and
applying an increased program voltage while applying a first reprogram permission voltage to bit lines coupled to memory cells that previously passed the program verification but has failed the first program re-verification,
wherein the first reprogram permission voltage is lower than the program prohibition voltage and higher than the program permission voltage.

12. The method of claim 11, further comprising:
performing a second program re-verification operation on the memory cells that have passed the first program re-verification; and
applying an increased program voltage while applying a second reprogram permission voltage to bit lines coupled to memory cells that previously passed the program verification and the first program re-verification but has failed the second program re-verification.

13. The method of claim 12, wherein the second reprogram permission voltage is higher than the first reprogram permission voltage.

14. The method of claim 11, wherein the program voltage is increased by a step voltage of an incremental step pulse program.

15. The method of claim 14, wherein the first reprogram permission voltage is two times greater than the step voltage, and the second reprogram permission voltage is three times greater than the step voltage.

16. The method of claim 11, wherein the program operation is ended if all the memory cells have passed the program verifications and the program re-verifications.

* * * * *